United States Patent
Conrad et al.

(10) Patent No.: US 7,171,319 B2
(45) Date of Patent: Jan. 30, 2007

(54) METHOD AND APPARATUS TO SEPARATE FIELD AND GRID PARAMETERS ON FIRST LEVEL WAFERS

(75) Inventors: Edward W. Conrad, Jeffersonville, VT (US); Paul D. Sonntag, JJeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,222

(22) Filed: Sep. 2, 2004

(65) Prior Publication Data
US 2006/0047456 A1   Mar. 2, 2006

(51) Int. Cl.
*G01C 17/38* (2006.01)
(52) U.S. Cl. ......................................... 702/94; 702/150
(58) Field of Classification Search ................. 702/87, 702/94–95; 700/56–59
See application file for complete search history.

(56) References Cited

U.S. PATENT DOCUMENTS

| | | | |
|---|---|---|---|
| 5,734,594 A * | 3/1998 | Chu et al. ................... 700/279 |
| 5,763,894 A | 6/1998 | Enichen et al. |
| 5,976,737 A * | 11/1999 | Oka ............................ 430/22 |
| 6,269,322 B1 * | 7/2001 | Templeton et al. .......... 702/150 |
| 6,418,388 B1 * | 7/2002 | Dietmayer .................... 702/95 |
| 6,436,595 B1 | 8/2002 | Credendino et al. |
| 6,498,352 B1 * | 12/2002 | Nishi .......................... 250/548 |
| 6,528,219 B1 | 3/2003 | Conrad et al. |
| 6,557,163 B1 | 4/2003 | Rankin et al. |
| 6,906,780 B1 * | 6/2005 | Smith .......................... 355/52 |
| 2003/0020889 A1 | 1/2003 | Takahashi |
| 2004/0138842 A1 * | 7/2004 | Leroux ......................... 702/94 |
| 2005/0254030 A1 * | 11/2005 | Tolsma et al. ................. 355/53 |

* cited by examiner

*Primary Examiner*—John Barlow
*Assistant Examiner*—Jonathan Moffat
(74) *Attorney, Agent, or Firm*—Scully, Scott, Murphy & Presser, P.C.; Anthony J. Canale

(57) ABSTRACT

Disclosed are a method and system for calibrating grid parameters for a photolithographic tool. One embodiment of the invention utilizes at least two artifacts located on the wafer stage. The artifacts are located outside of the area where a substrate would be placed. Typically, four artifacts are used, with two artifacts located along the same axis. The stage moves a first artifact to the alignment system and the system measures the location of the first artifact. The stage then moves the second artifact, which is on the same axis but on the other side of the wafer stage, under the alignment system and measures the location of the second artifact. This is repeated for the other two artifacts that line up in a second axis (i.e., perpendicular to the first axis). Grid offsets are calculated to provide, for example, grid magnification and rotation calibrations.

19 Claims, 5 Drawing Sheets

PRIOR ART

METHOD AND APPARATUS TO SEPARATE FIELD AND GRID PARAMETERS ON FIRST LEVEL WAFERS

BACKGROUND OF INVENTION

1. Field of the Invention

This invention generally relates to photolithography, and more specifically, the invention relates to methods and systems for determining grid offsets for a photolithographic tool.

2. Background Art

Step-and-expose and step-and-scan photolithography tools (referred to as "steppers") are used extensively in the manufacture of large scale integrated circuits. A principal advantage of the use of steppers for the manufacture of integrated circuits is the ability of steppers to rapidly produce very fine patterns on the resist coated wafers.

In use, the stepper patterns wafers by producing a plurality of essentially identical fields that are placed adjacent to each other. The area of the wafer to be patterned is placed under the objective lens of the stepper and the field is exposed. The stepper then moves the wafer stage to the next portion of the wafer to be exposed. This process continues until all areas of the wafer requiring patterning have been exposed.

As integrated circuits require many levels of layers that must be properly placed relative to one another, steppers include an alignment system to aid in achieving the proper relative placement of the current level to the prior level or levels. However, the very first level to be printed on the wafer does not have access to alignment marks and this first level is exposed without the use of the alignment system. This first level exposure process without the aid of the alignment system is sometimes referred to as "blind stepping." The first level exposure of multiple copies of identical fields can be modified by standard stepper systematic parameters. These include the field systematic parameters of field x magnification, field y magnification, field rotation, and field orthogonality. The first level exposure includes grid parameters of grid x magnification, grid y magnification, grid rotation and grid orthogonality.

In order to insure optimum overlay for subsequent levels, it is critical that the first level be exposed with known placement characteristics. To achieve these optimum results, it is essential that the field systematic parameters match the associated grid parameters. Also, when the stepper parameters that are applied at run-time are determined using feedback from lots previously exposed, it is important that the first level placement characteristics be consistent from lot to lot and preferably match the stepper baseline characteristics.

SUMMARY OF INVENTION

An object of this invention is to improve methods and systems for calibrating systematic grid parameters for a photolithographic tool.

Another object of the invention is to allow grid terms, in a photolithography procedure, to be measured independently of field terms.

A further object of the invention is to provide a stepper photolithography tool in which first level placement characteristics are consistent from lot to lot.

These and other objectives are attained with a method and system for calibrating grid parameters for a photolithographic tool. One embodiment of the invention utilizes artifacts located on the wafer stage. The artifacts are located outside of the area where a substrate would be placed. Typically, four artifacts are used, with two artifacts located along the same axis. The stage moves a first artifact to the alignment system and the system measures the location of the first artifact. The stage then moves the second artifact, which is on the same axis but on the other side of the wafer stage, under the alignment system and measures the location of the second artifact.

This is repeated for the other two artifacts that line up in a second axis (i.e., perpendicular to the first axis). Grid offsets are calculated to provide, for example, grid magnification and rotation calibrations.

The preferred embodiments of the invention, described below in detail, have a number of advantages. For example, the invention allows grid terms to be measured independently of field terms, and when combined with the current practice, the invention allows the calculation of separate field errors and grid errors. In addition, the present invention does not require a separate photo level. Because of this, the invention reduces the cost of the product and, also, is not based on an assumption that the tool that laid down the photo, or zero, level, had no grid errors.

Further benefits and advantages of the invention will become apparent from a consideration of the following detailed description, given with reference to the accompanying drawings, which specify and show preferred embodiments of the invention.

DETAILED DESCRIPTION

Figure 1:
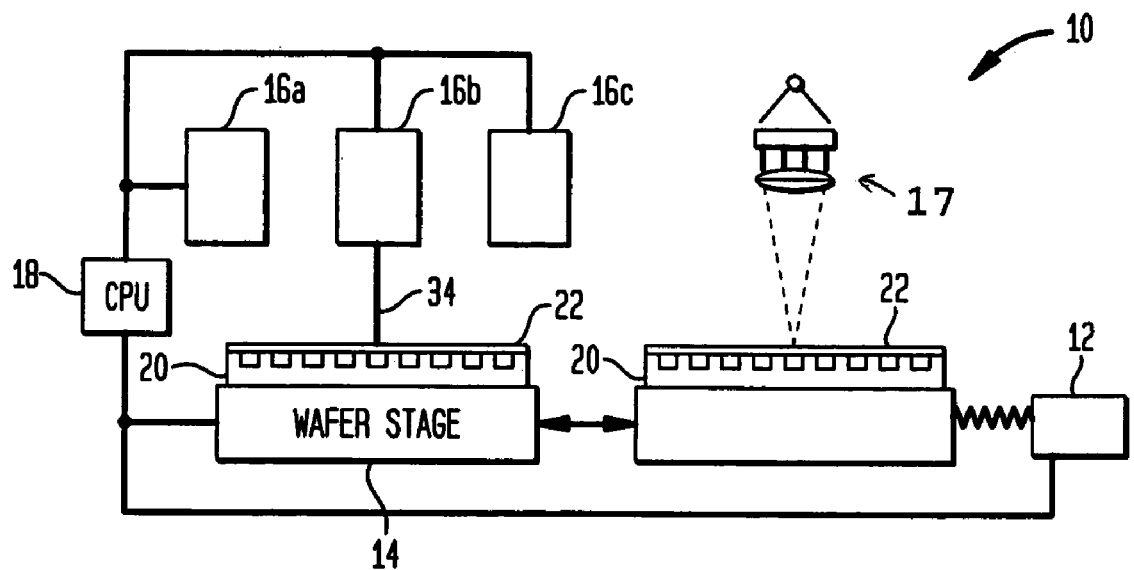
FIG. 1 schematically illustrates a photolithography system that may be used in the practice of this invention.

The preferred embodiment of the invention applies to step-and-repeat or step-and-scan photolithography tools such as tool 10 shown in FIG. 1. Photolithography tool 10 includes laser interferometer 12, which controls wafer stage 14. Tool 10 also includes alignment systems 16a, 16c, exposure apparatus 17 and computer 18 to analyze alignment data. A substrate, such as silicon wafer 20, coated with photosensitive layer 22 is located on wafer state 14.

Figure 2:
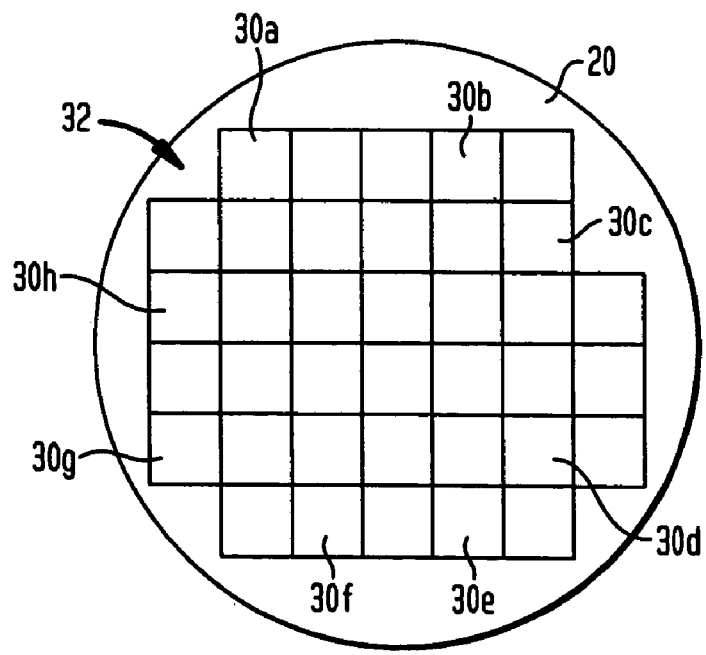
FIG. 2 is a top view of a waver having multiple exposure fields.

With reference to FIG. 2, in standard practice, step-and-repeat or step-and-scan photolithography tools place exposure fields 30a, 30b . . . 30i on wafer 20 in an array pattern 32. In this operation, each alignment system 16a, 16b, 16c shines incident light beam 34 from a light source on wafer 20. The different alignment systems may be used either sequentially or in parallel, and data is collected for each alignment system.

As mentioned above, the first level of patterns to be printed on the wafer 20 does not have access to conventional alignment marks; and in order to form that first level, instrument parameters, referred to as field and grid parameters, are used. Today, through the use of overlapping metrology image, the difference between field and grid terms can be determined, however, grid terms cannot be separated from the field terms. As a result, adjustments to systematic errors are made based on the assumption that the grid terms are not fluctuating and that all variability seen is a result of fluctuations in field terms.

Figure 3:
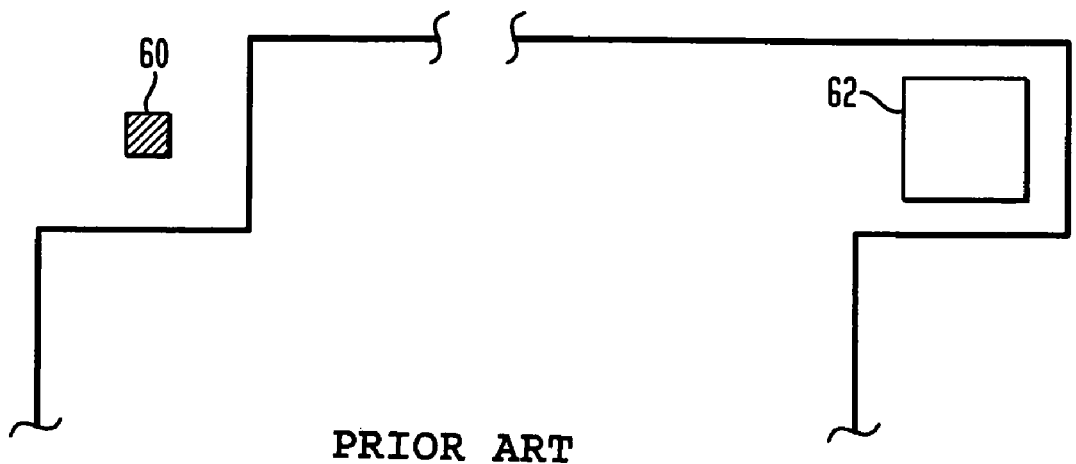
FIGS. 3 and 4 illustrate an existing procedure for measuring the difference between field and grid parameters in the photolithography system of FIG. 1.
Figure 4:
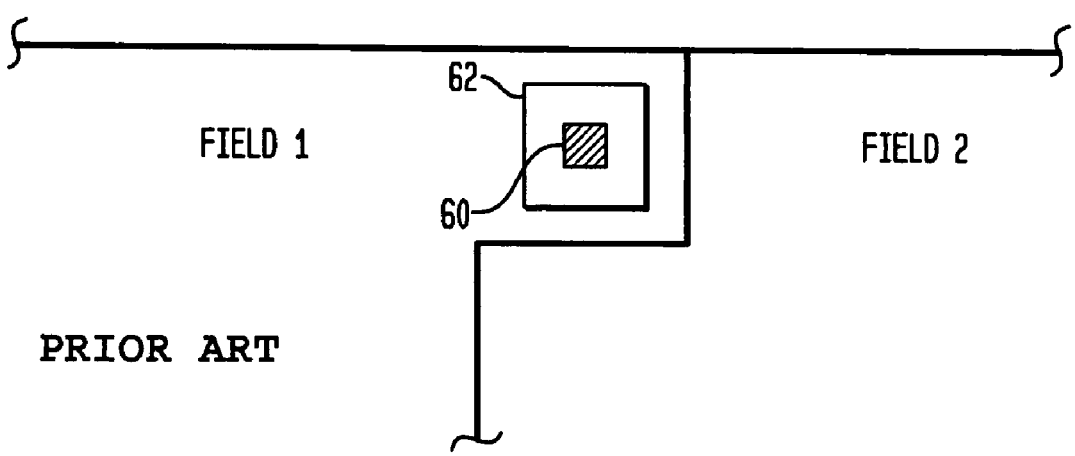

FIGS. 3 and 4 illustrate an existing procedure for measuring the difference between field and grid parameters. In this current practice, to get both field and grid parameters, the first level pattern forms measurable overlay structures 60 and 62 as fields are stepped across the wafer 20. This existing practice may be continued, in combination with the preferred implementations of the present invention, to gather field-to-grid data.

The present invention provides methods and systems to independently measure grid parameters. Generally, the invention requires the use of two to four artifacts on the wafer stage, surrounding the wafer chuck. The wafer stage should preferably be made of a material that has zero coefficient of thermal expansion.

Figure 5:
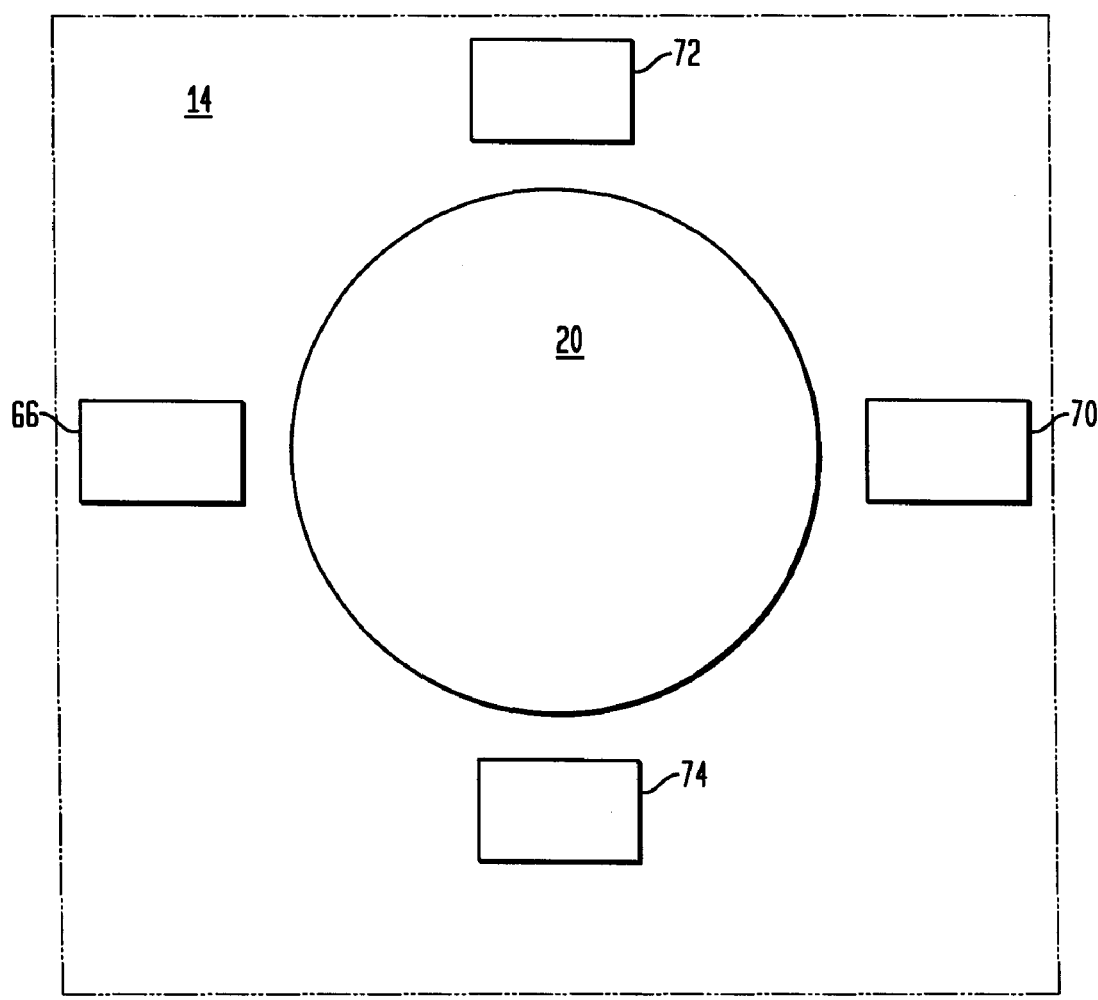
FIG. 5 shows a first embodiment of the present invention.

FIG. 5 illustrates a first embodiment of the invention. At some frequency, whether before exposing the lot or each wafer, the wafer stage moves one stage artifact 66 to the alignment system, and the system measures the location of the artifact. The stage 14 now moves the artifact 70 that is in the same axis but on the other side of the wafer chuck, under the alignment system, and this system measures the location of this artifact 70.

This process is repeated for the two artifacts 72 and 74 that line up in the opposite axis. Since the physical distance between each artifact of a pair is known, the difference between the distance as measured by the interferometer of system and the known distance, provides grid magnification and rotation calibrations. These calibration factors can now be introduced while the first level wafers are being stepped.

Figure 6:
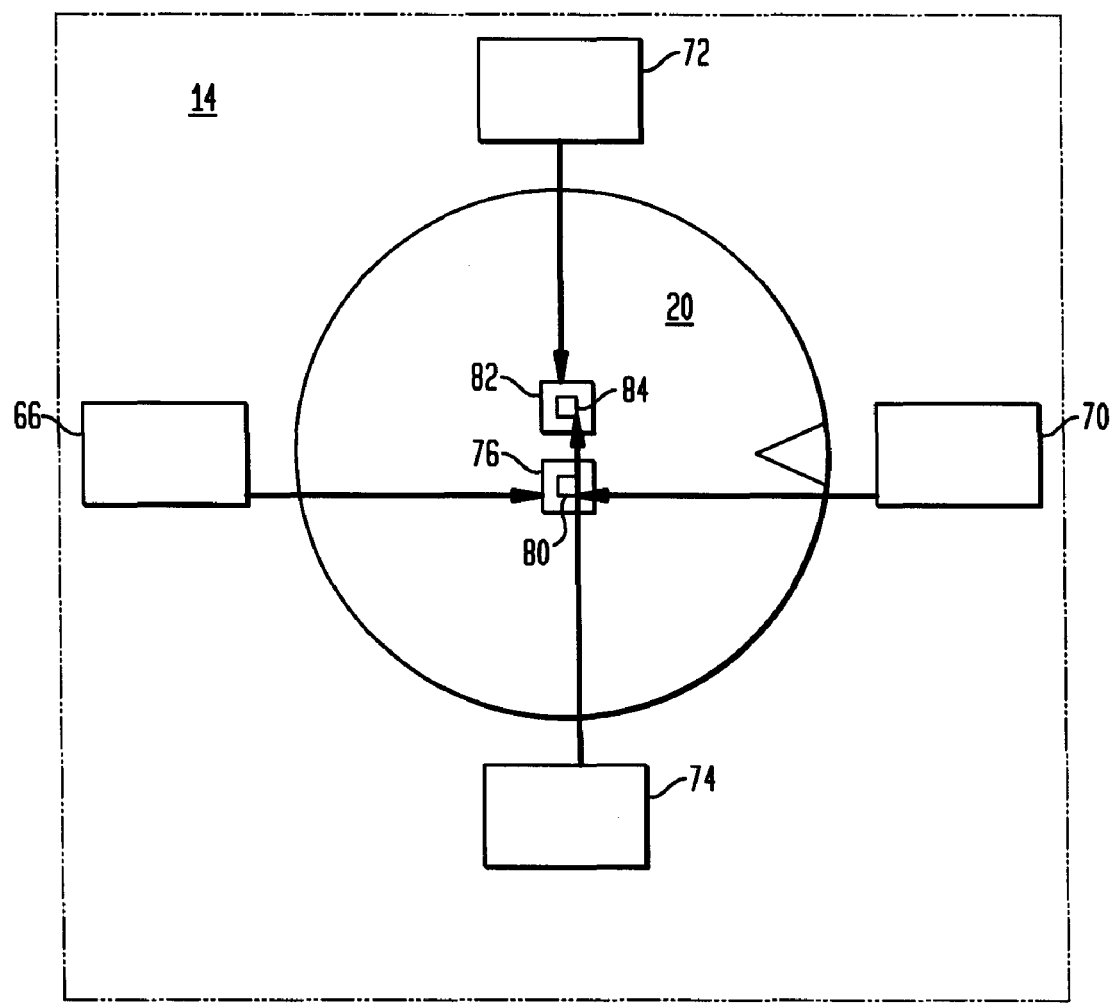
FIG. 6 illustrates a second embodiment of the invention.

FIG. 6 illustrates a second embodiment of the invention. This embodiment may be used with one or more wafers. The wafer stage is moved so that one artifact 66 is under the alignment system, and the location of the artifact is measured. Next, the wafer stage 14 is moved a predetermined distance, and one-half 76 of a complete overlay metrology structure is exposed. The wafer stage is moved so that the other artifact 70 in the same axis is under the alignment system, and the location of this artifact is measured. Now, the wafer stage is moved, and the other one-half 80 of the overlay metrology structure is exposed so that both exposed areas form a complete metrology structure (like KLA box in box).

The above-process may be repeated for the stage artifacts 72 and 74 in the other axis to form structures 82 and 84. The overlay structures are measured on a metrology tool. The measured overlay offsets are caused by grid placement errors, and calibration factors can be calculated and used for future wafers.

Figure 7:
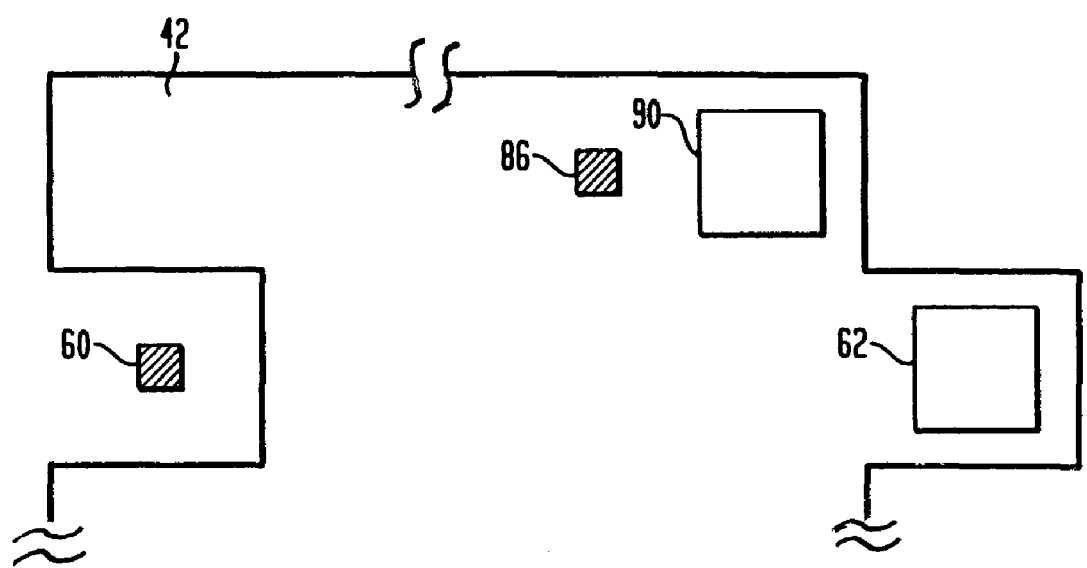
FIG. 7 depicts a third embodiment of this invention.

FIG. 7 illustrates a third embodiment of the invention. With this embodiment, in addition to the interlocking boxes on product, the first level pattern also includes overlay metrology marks 86 and 90 that do not form a measurable overlay structure as the fields are stepped across the wafer 42. Before the wafer is removed from the chuck, the lithography tool is moved to one of the stage artifacts (shown in FIGS. 5 and 6), and the position of the artifact is measured using the tool's alignment system. The lithography tool is moved a predetermined distance to the wafer, and the second part of an overlay metrology part on the wafer is exposed.

This procedure is repeated at each stage artifact position. Upon completion of wafer processing, the wafer is measured on the metrology tool. The metrology structures 60 and 62 formed as the fields were stepped on the wafer 20 are measured and analyzed for the difference between the field and grid parameters. The metrology structures 86 and 90 formed after movement from the stage artifact locations to the wafer locations are measured and analyzed to provide the grid parameters. From both sets of data, the field parameters can be mathematically obtained, and both field and grid offsets for future lots can be calculated.

The preferred embodiments of the invention, as discussed above in detail, have a number of advantages. For example, the invention allows grid terms to be measured independently of field terms, and when combined with the current practice, the invention allows the calculation of separate field errors and grid errors. In addition, the present invention does not require a separate photo level. Because of this, the invention reduces the cost of the product and, also, is not based on an assumption that the tool that laid down the photo, or zero, level, had no grid errors.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A method for determining grid parameters of a photolithographic tool having a wafer stage and an alignment system, the method comprising the steps:
   a. providing a plurality of artifacts on the wafer stage outside of the substrate area, the artifacts being placed a known distance apart from each other;
   b. measuring the distance between the artifacts with the alignment system; and
   c. determining the distance between the measured distance and the known distance between the artifacts; and
   d. using the determined distance between said measured and known distances to determine the grid parameters, including grid magnification and rotation calibrations, of the wafer stage of the photolithographic tool, independent of field parameters of said tool,
   e. Using said determined grid parameters to calibrate the photolithographic tool.

2. A method according to claim 1, wherein the measuring step includes the step of:
   moving a first of the artifacts to the alignment system;
   using the alignment system to measure the location of the first of the artifacts;
   moving a second of the artifacts to the alignment system; and
   using the alignment system to measure the location of the second of the artifacts.

3. A method according to claim 2, wherein the measuring step includes the further step of using said measurements of the locations of the first and second of the artifacts to determine the measured distance between the first and second of the artifacts.

4. A method according to claim 1, wherein the providing step includes the steps of:
   locating a first of the artifacts on a first side of said area; and
   locating a second of the artifacts on a second side of said area, said second side being opposite said first side.

5. A method according to claim 4, wherein both of said first and second of the artifacts are located on a common axis.

6. A method according to claim 1, wherein:
the providing step includes the steps of
   i) providing a first pair of artifacts a known distance apart from each other, and
   ii) providing a second pair of artifacts a known distance apart from each other; and the measuring step includes the steps of
   i) measuring the distance between the first pair of artifacts, and
   ii) measuring the distance between the second pair of artifacts.

7. A method according to claim 6, wherein:
the step of providing the first pair of artifacts includes the step of locating said first pair of artifacts on a first axis, on opposite sides of said area;
the step of providing the second pair of artifacts includes the step of locating said second pair of artifacts on a second axis, on opposite sides of said area; and
said second axis is perpendicular to the first axis.

8. A method according to claim 1, wherein:
said grid parameters are grid placement errors;
said grid magnification and rotation calibrations are introduced while first level wafers are being stepped; and
the using step includes the step of calculating separate field errors and grid errors.

9. A method for determining grid parameters of a photolithographic tool having a wafer stage and an alignment system, the method comprising the steps:
   a. positioning a wafer on the stage;
   b. providing a plurality of artifacts on the wafer stage outside of the wafer, the artifacts being a known distance apart from each other;
   c. positioning a first of the artifacts at a defined location relative to the alignment system;
   d. moving the wafer stage a predetermined distance, and forming a first structure on the wafer;
   e. positioning a second of the artifacts at a defined location relative to the alignment system;
   f. moving the wafer stage a predetermined distance, and forming a second structure on the wafer; and
   g. measuring the offset between said first and second structures; and
   h. using the measured offset between said first and second structures to determine the grid parameters of the wafer stage, including grid magnification and rotation calibrations, of the photolithographic tool, independent of field parameters of said tool,
   i. Using said determined grid parameters to calibrate the photolithographic tool.

10. A method according to claim 9, wherein the step of providing the plurality of artifacts includes the step of positioning the first and second of the artifacts on a common axis, on opposite sides of the wafer.

11. A method according to claim 10, wherein the step of forming the second structure includes the step of forming the second structure on top of the first structure.

12. A method according to claim 9, wherein:
said first and second structures are spaced apart; and further comprising the steps of:
forming another pair of structures on the wafer;
measuring the distance between said another pair of structures, and using the measured distance between said another pair of structures to determine the difference between field and grid parameters; and
using the measured offset between the first and second structures to provide the grid parameters.

13. Apparatus for determining grid parameters of a photolithographic tool having a wafer stage and an alignment system, said wafer stage including a defined substrate area for receiving a substrate of an integrated circuit, the apparatus comprising:
   a. a plurality of artifacts on the wafer stage outside of the substrate area, the artifacts being placed a known distance apart from each other;
   b. means for measuring the distance between the artifacts with the alignment system; and
   c. means for determining the distance between the measured distance and the known distance between the artifacts; and
   d. means for using the determined distance between said measured and known distances to determine the grid parameters, including grid magnification and rotation calibrations, of the wafer stage of the photolithographic tool, independent of field parameters of said tool.

14. Apparatus according to claim 13, wherein the photolithography tool further includes an alignment system, and the measuring means includes:
   means for moving a first and a second of the artifacts to the alignment system;
   means for using the alignment system to measure the locations of the first and second of the artifacts; and
   means for using said measurements of the locations of the first and second of the artifacts to determine the measured distance between the first and second of the artifacts.

15. Apparatus according to claim 13, wherein the first and second of the artifacts are located on a common axis, on opposite sides of said area.

16. Apparatus according to claim 13, wherein:
the plurality of artifacts include
   i) a first pair of artifacts a known distance apart from each other, on a first axis and on opposite sides of said area, and
   ii) a second pair of artifacts a known distance apart from each other, on a second axis and on opposite sides of said area; and
the measuring means includes means for measuring the distance between the first pair of artifacts and the distance between the second pair of artifacts.

17. Apparatus for determining grid parameters of a photolithographic tool having a wafer stage, a wafer on the wafer stage and an alignment system, the apparatus comprising:
   a. a plurality of artifacts on the wafer stage outside of the wafer, the artifacts being a known distance apart from each other;
   b. means for positioning a first and a second of the artifacts at defined locations relative to the alignment system, and for moving the wafer stage predetermined distances from said defined locations;
   c. means for forming first and second structures on the wafer, after said wafer stage has been moved said predetermined distances;
   d. means for measuring the offset between said first and second structures; and
   e. means for using the measured offset between said first and second structures to determine the grid parameters, including grid magnification and rotation calibrations, of the wafer stage of the photolithographic tool, independent of field parameters of said tool.

18. Apparatus according to claim 17, wherein the first and second of the artifacts are on a common axis, on opposite sides of the wafer.

19. Apparatus according to claim 17, wherein:

said first and second structures are spaced apart;

said means for forming are used to form another pair of structures on the wafer;

said measuring means are used to measure the distance between said another pair of structures, to use the measured distance between said another pair of structures to determine the difference between field and grid parameters, and to use the measured offset between the first and second structures to provide the grid parameters.

* * * * *